United States Patent [19]

Ozawa et al.

[11] Patent Number: 5,373,175
[45] Date of Patent: Dec. 13, 1994

[54] OHMIC ELECTRODE AND A LIGHT EMITTING DEVICE

[75] Inventors: Masafumi Ozawa; Satoshi Ito; Fumiyo Narui, all of Kanagawa, Japan

[73] Assignee: Sony Corporation, Tokyo, Japan

[21] Appl. No.: 136,870

[22] Filed: Oct. 18, 1993

[30] Foreign Application Priority Data

Oct. 23, 1992 [JP] Japan .................. 4-309603
Jan. 28, 1993 [JP] Japan .................. 5-032741

[51] Int. Cl.$^5$ .................................. H01L 33/00
[52] U.S. Cl. .................................. 257/99; 257/734; 257/743; 257/744
[58] Field of Search ............... 257/12, 15, 94, 96, 257/97, 99, 741, 744, 768, 734, 743; 372/43, 45, 46

[56] References Cited

U.S. PATENT DOCUMENTS

| | | | |
|---|---|---|---|
| 4,098,921 | 7/1978 | Calviello | 257/473 |
| 4,350,990 | 9/1982 | Lo | 257/744 |
| 4,414,561 | 11/1983 | Keramidas et al. | 257/743 |
| 4,514,896 | 5/1985 | Dixon et al. | 257/79 |
| 4,563,764 | 1/1986 | Kuroda et al. | 272/45 |
| 5,045,502 | 9/1991 | Lau et al. | 257/745 |
| 5,081,632 | 1/1992 | Migita et al. | 257/94 |
| 5,187,547 | 2/1993 | Niina et al. | 257/99 |
| 5,217,539 | 6/1993 | Fraas et al. | 257/431 |
| 5,274,248 | 12/1993 | Yokogawa et al. | 257/96 |

FOREIGN PATENT DOCUMENTS

| | | | |
|---|---|---|---|
| 0045644 | 2/1982 | European Pat. Off. | 257/99 |
| 61-26271 | 2/1986 | Japan | 257/97 |
| 63-95692 | 4/1988 | Japan | 257/97 |
| 127832 | 5/1993 | Japan | 257/99 |
| 065920 | 1/1994 | Japan | 257/99 |

OTHER PUBLICATIONS

Article Electronics Letter, 10 Sep. 1992, vol. 28, No. 19 pp. 1798–1799, Okuyama et al., "ZnSe/ZnMgSSe Blue Laser Diode".

Electronics Letters of 4th Mar. 1993, vol. 29, No. 5, pp. 503–505, "Au (Pt)Pd Ohmic Contacts to p-ZnTe", Ozawa et al.

Patent Abstracts of Japan Publication No. JP21-22565, May 10, 1990, Akira, "Ohmic electrode Formation for P-type ZnSe".

Article Microelectronics and Reliability, vol. 27, No. 4, 1987, pp. 677–684, Hajghassem et al., "Stable Ohmic Contact to Zinc Telluride".

*Primary Examiner*—Rolf Hille
*Assistant Examiner*—Minhloan Tran
*Attorney, Agent, or Firm*—Hill, Steadman & Simpson

[57] ABSTRACT

An ohmic electrode to p-type II–VI compound semiconductor and its fabricating method are disclosed. The ohmic electrode comprises: a layer made of Pd or an alloy containing Pd; and a metal layer provided thereon. The fabricating method of an ohmic electrode comprises the steps of: providing a layer made of Pd or an alloy containing Pd on a p-type II–VI compound semiconductor layer; and providing a metal layer on the layer made of Pd or an alloy containing Pd. Light emitting devices such as a semiconductor laser and a light emitting diode which use the ohmic electrode as the p-side electrode are also disclosed.

7 Claims, 7 Drawing Sheets

Au/Pd WITHOUT ANNEALING

Au/Pd AFTER ANNEALING AT 250°C

OHMIC ELECTRODE AND A LIGHT EMITTING DEVICE

BACKGROUND OF THE INVENTION

1. Field of the Invention

This invention relates to an ohmic electrode, its fabricating method and a light emitting device, and more particularly, to an ohmic electrode onto a p-type II–VI compound semiconductor of p-type ZnTe or the like, its fabricating method, and a light emitting device using the ohmic electrode as its p-side electrode.

2. Description of the Related Art

In recent years, there are active trials for realizing light emitting devices capable of emitting blue to green light, by using a II–VI compound semiconductor of ZnSe or the like. Regarding such light emitting devices using a II–VI compound semiconductor, attention has been paid to that ZnTe which can obtain a p-type crystal having a relatively high carrier concentration is used as a contact layer (also called a cap layer) of a p-side electrode (Japanese Laid Open Patent Publication No. 122565/1990).

In general, Au or Ag is used as a material of the ohmic electrode onto the p-type ZnTe (for example, Semiconductor Handbook (Second Edition), Ohm-sha Limited., p.157.). In lieu of Au or Ag, Pt having a large work function may be used.

There is a description of an Au/Pd electrode provided on a p-type ZnSe in ELECTRONICS LETTER 10th September 1992, Vol. 28, No. 19, pp. 1798–1799. However, no good ohmic characteristic has been obtained.

Since the metals, Au, Ag and Pt, are not reliable in terms of adhesion to p-type ZnTe, and subjected to exfoliation, it is difficult to execute lift-off, cleavage or other processes after depositing such a metal by vacuum evaporation. Further, because of the liability to exfoliation, devices using such metals are not reliable.

The adhesion would be improved by making Au or Ag contact with p-type ZnTe via a Ti film which is widely used to improve adhesion of an ohmic electrode to III–V compound semiconductor. However, it has been recognized through experiments of the present Inventors that the use of a Ti film deteriorates the ohmic characteristic of the electrode.

OBJECTS AND SUMMARY OF THE INVENTION

It is therefore an object of the invention to provide an ohmic electrode which exhibits an excellent adhesion to p-type II–VI compound semiconductor such as p-type ZnTe, p-type $ZnSe_xTe_{1-x}$ and ZnSe/ZnTe superlattice, and a method for fabricating the same.

Another object of the invention is to provide a method for fabricating an ohmic electrode, capable of fabricating an ohmic electrode which is excellent in adhesion and low in specific contact resistance with respect to p-type II–VI compound semiconductor such as p-type ZnTe, p-type $ZnSe_xTe_{1-x}$ and ZnSe/ZnTe superlattice.

Still another object of the invention is to provide a light emitting device whose ohmic electrode exhibits an excellent adhesion to p-type II–VI compound semiconductor such as p-type ZnTe, p-type $ZnSe_xTe_{1-x}$ and ZnSe/ZnTe superlattice.

According to an aspect of the invention, there is provided an ohmic electrode comprising:

a layer made of Pd or an alloy containing Pd in contact with a p-type II–VI compound semiconductor; and a metal layer provided on the layer made of Pd or an alloy containing Pd.

According to another aspect of the invention, there is provided a method for fabricating an ohmic electrode comprising the steps of:

providing a layer made of Pd or an alloy containing Pd on a p-type II–VI compound semiconductor layer by a vapor deposition method; and providing a metal layer on the layer made of Pd or an alloy containing Pd.

According to still another aspect of the invention, there is provided a light emitting device comprising:

an n-type first II–VI compound semiconductor layer;

a p-type second II–VI compound semiconductor layer provided on the n-type first II–VI compound semiconductor layer;

a first electrode electrically connected to the n-type first II–VI compound semiconductor layer; and a second electrode electrically connected to the p-type second II–VI compound semiconductor layer, the second electrode being in contact with a p-type third II–VI compound semiconductor layer and a portion of the second electrode in contact with the p-type third II–VI compound semiconductor layer being made of Pd or an alloy containing Pd.

As the vapor deposition method for fabricating an ohmic electrode in the invention, a vacuum evaporation method, a sputtering method or the like may be used.

As the p-type II–VI compound semiconductor in the invention, a II–VI compound semiconductor comprising one or more group II elements selected from a group consisting of Mg, Zn and Cd and one or more group VI elements selected from a group consisting of S, Se and Te may be used besides ZnTe, ZnSe and ZnSe/ZnTe superlattice The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
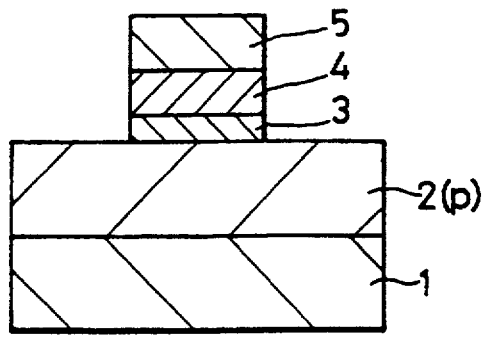
FIG. 1 is a cross sectional view for explaining a first embodiment of the invention.

Embodiments of the invention are explained below with reference to the drawings. In all of the drawings, the same and corresponding parts are labeled with the same reference numerals.

First explained is a first embodiment of the invention.

Figure 2:
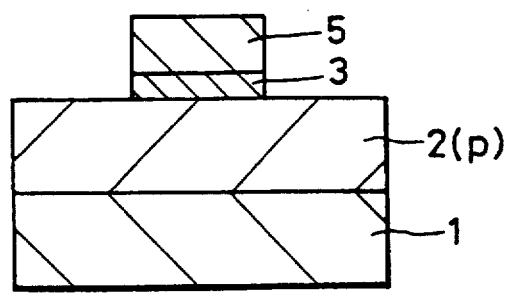
FIG. 2 is a cross sectional view for explaining the first embodiment of the invention.

In the first embodiment, two kinds of ohmic electrodes shown in FIGS. 1 and 2 are made.

In the example of FIG. 1, stacked on, for example, a (001)-oriented semi-insulating GaAs substrate 1 is a p-type ZnTe layer 2 in which a p-type impurity, e.g., N, is doped at a high concentration. Provided on the p-type ZnTe layer 2 is an ohmic electrode in the form of a metal multi-layered film of a three-layered structure including a Pd film 3, a Pt film 4 and an Au film 5. Exemplary thicknesses of these films are: 1 $\mu$m for the p-type ZnTe layer 2; 3 to 50 nm, preferably 4 to 15 nm, more preferably 5 to 10 nm, for the Pd film 3; 100 nm for the Pt film 4; and 300 nm for the Au film 5. The ohmic electrode, as a whole, exhibits a cylindrical configuration whose diameter may be 1.5 mm. Although the drawings show only one, a number of such ohmic electrodes are provided in array arrangement on the p-type ZnTe layer 2 at, for example, 1.5 mm intervals.

In this case, the Au film 5 is used only for purposes that the top layer be the same as that of the ohmic electrode of FIG. 2 to provide the same condition for measurement of current-voltage characteristics, referred to later, and that a probe stuck upon measurement does not break through. It is therefore not essential.

The ohmic electrode shown in FIG. 1 is fabricated by the following method.

A p-type ZnTe layer 2 is epitaxially grown on, for example, a (001)-oriented semi-insulating GaAs substrate 1 by, for example, the molecular beam epitaxy (MBE) method. The growth temperature for the epitaxial growth may be 280° C. The epitaxial growth by MBE uses, for example, Zn of purity 99.9999% as a Zn source material and Se of purity 99.9999% as a Se source material. Further, doping of N as a p-type impurity for the p-type ZnTe layer 2 is done by irradiating $N_2$ plasma produced by, for example, electron cyclotron resonance (ECR). After that, the surface of the p-type ZnTe layer 2 is cleaned sequentially with acetone, which is an organic solvent, and deionized water. An oxide layer or stains, if any, is removed by chemical etching using, for example, hydrochloric acid (HCl). The organic solvent may be, for example, methanol.

Figure 3:
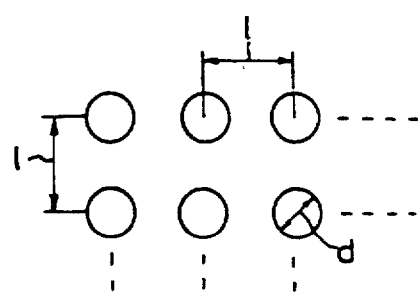
FIG. 3 is a plan view for explaining the first embodiment.

Next, a Pd film 3, a Pt film 4 and an Au film 5 are sequentially deposited on the p-type ZnTe layer 2 by vacuum evaporation in, for example, a vacuum evaporation apparatus using an electron beam. In this case, by using a metal mask having a mask pattern in which circular holes are arranged in arrays, for example, as shown in FIG. 3, a number of ohmic electrodes having the Au/Pt/Pd structure shown in FIG. 1 are simultaneously fabricated in the form of arrays on the p-type ZnTe layer 2. The diameter d of each of the circular holes of FIG. 3 and the distance 1 among them are determined in accordance with the arrays of the ohmic electrodes to be fabricated, and they may be, for example, 1.5 mm, respectively, as indicated above.

A number of ohmic electrodes having the same cylindrical Au/Pt/Pd structure, as referred to above, can be fabricated simultaneously in the form of arrays by first depositing the Pd film 3, the Pt film 4 and the Au film 5 in sequence on the p-type ZnTe layer 2 by vacuum evaporation and by etching these Pd film 3, Pt film 4 and Au film 5 thereafter by using a resist pattern or the like as a mask, in lieu of using the aforementioned metal mask. Alternatively, a number of ohmic electrodes having the same cylindrical Au/Pt/Pd structure can be fabricated simultaneously in the form of arrays by first making a resist pattern having the same configuration as that of FIG. 3 on the p-type ZnTe layer 2, by depositing the Pd film 3, the Pt film 4 and the Au film 5 in sequence by vacuum evaporation, and by executing lift-off thereafter.

On the other hand, in the example shown in FIG. 2, the same p-type ZnTe layer 2 as shown in FIG. 1 is stacked on the semi-insulating GaAs substrate 1. Fabricated thereon is an ohmic electrode in the form of a multi-layered metal film of a two-layered structure including the Pd film 3 and the Au film 5. Exemplary thicknesses of these films are: 1 $\mu$m for the p-type ZnTe layer 2; 3 to 50 nm, preferably 4 to 15 nm, more preferably 5 to 10 nm, for the Pd film 3; and 300 nm for the Au film 5.

The ohmic electrode is the same as that shown in FIG. 1 in that the entire structure exhibits a cylindrical configuration and that a number of such ohmic electrodes are fabricated in the form of arrays on the p-type ZnTe layer 2. In addition, the method for fabricating the ohmic electrode is the same as the method for fabricating the ohmic electrode shown in FIG. 1, and its explanation is omitted here.

Figure 4:
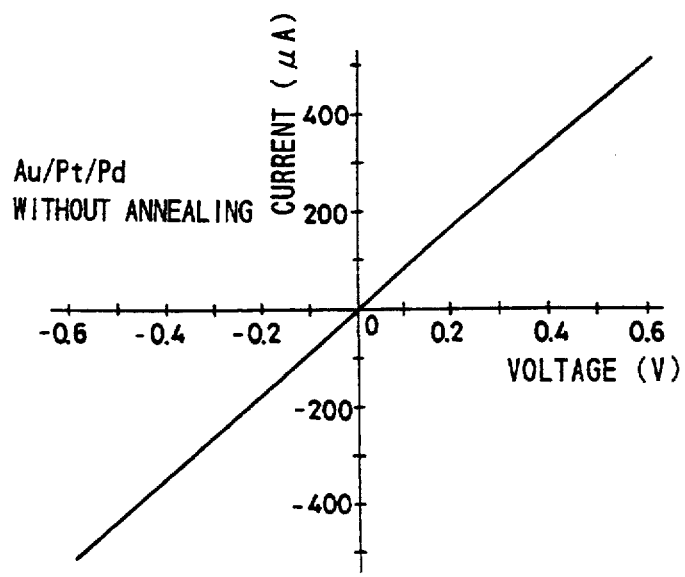
FIG. 4 is a graph showing a result of measuring the I–V characteristic of an ohmic electrode of an Au/Pt/Pd structure provided on a p-type ZnTe layer.
Figure 5:
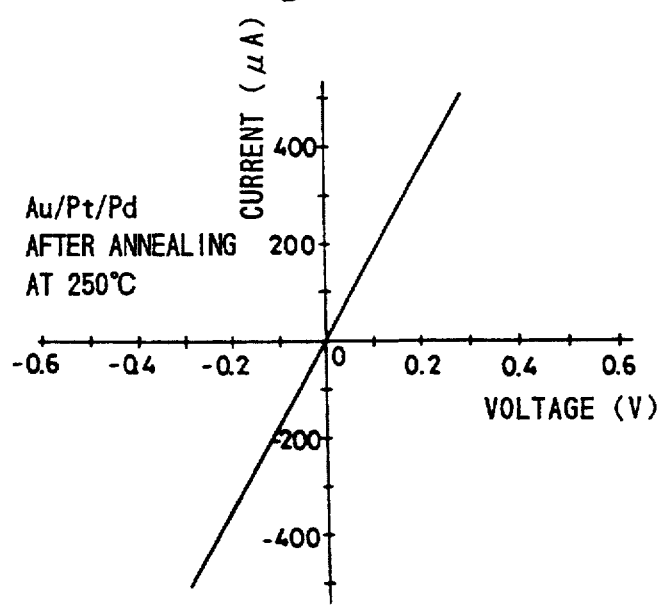
FIG. 5 is a graph showing a result of measuring the I–V characteristic of an ohmic electrode of the Au/Pt/Pd structure provided the p-type ZnTe layer and annealed at 250° C. thereafter.
Figure 6:
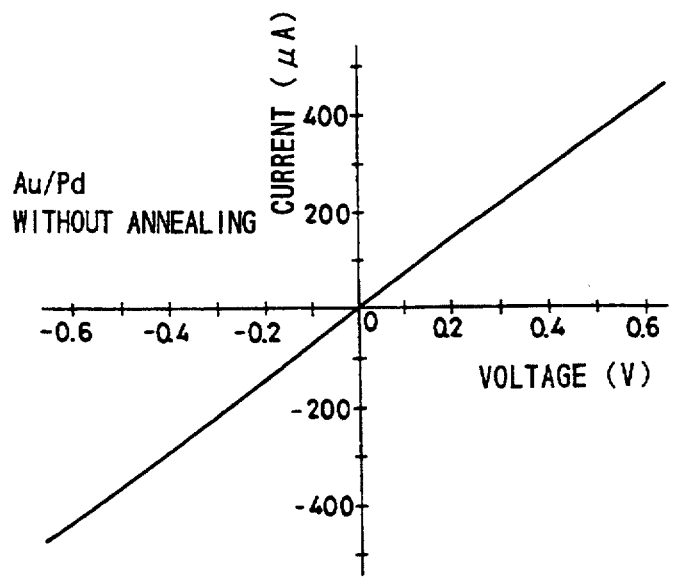
FIG. 6 is a graph showing a result of measuring the I–V characteristic of an ohmic electrode of an Au/Pd structure provided on a p-type ZnTe layer.
Figure 7:
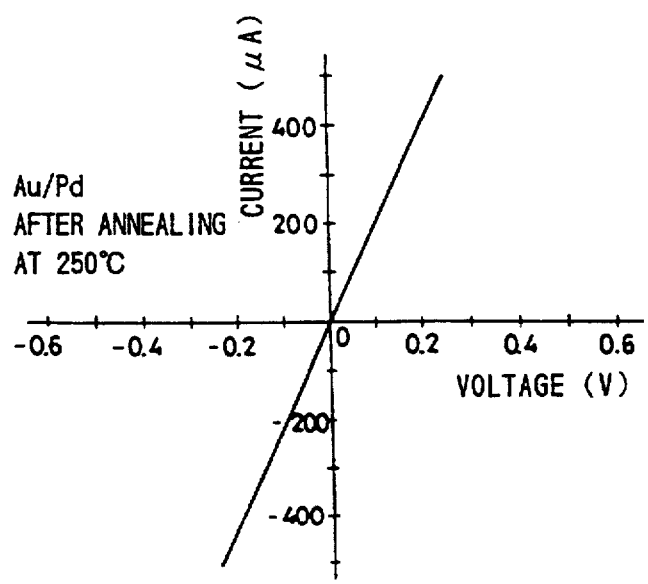
FIG. 7 is a graph showing a result of measuring the I–V characteristic of an ohmic electrode of the Au/Pd structure provided on the p-type ZnTe layer and annealed at 250° C. thereafter.

FIG. 4 shows a result of measuring the current-voltage (I–V) characteristic between nearest two ohmic electrodes among a number of ohmic electrodes having the Au/Pt/Pd structure shown in FIG. 1, which were fabricated in arrays on the p-type ZnTe layer 2. FIG. 5 shows a result of measuring the I–V characteristic of such ohmic electrodes after annealed at 250° C. while introducing $H_2$ gas by a typical annealing furnace after fabrication of the ohmic electrodes. Similarly, FIG. 6 shows a result of measuring the I-V characteristic between nearest two ohmic electrodes among a number of ohmic electrodes having the Au/Pd structure shown in FIG. 2, which were fabricated in arrays on the p-type ZnTe layer 2. FIG. 7 shows a result of measuring the I-V characteristic of such ohmic electrodes after annealed at 250° C. while introducing $H_2$ gas by a typical annealing furnace after fabrication of the ohmic electrodes.

The hole concentration of a p-type ZnTe layer 2 of a sample used for measurement was $p = 8.5 \times 10^{17}$ cm$^{-3}$ in terms of the Hall measurement value, the thickness of its Pd film 3 was 10 nm, the thickness of its Pt film 4 was 100 nm, and the thickness of its Au film 5 was 300 nm.

It is known from FIGS. 4 and 6 that, either with the ohmic electrode having the Au/Pt/Pd structure shown in FIG. 1 or with the ohmic electrode having the Au/Pt structure shown in FIG. 2, an excellent ohmic characteristic is obtained without annealing after fabrication of ohmic electrodes. This is greatly different from ohmic electrodes using Au or Ag as its material, which require an alloying process after fabrication of electrodes to obtain an ohmic contact.

It is also known from FIGS. 5 and 7 that the series resistance component decreased after the ohmic electrodes are annealed at 250° C. as compared with that before annealing. This shows that annealing after fabrication of ohmic electrodes decreases the specific contact resistance of the ohmic electrodes with respect to the p-type ZnTe layer 2.

Specific contact resistances of respective metals with respect to p-type ZnTe after annealing at 250° C. were: $>10^{-2}$ $\Omega$cm$^2$ for Au, $\sim 10^{-3}$ cm$^2$ for Au/Pd, $\sim 10^{-2}$ $\Omega$cm$^2$ for Au/Pt, and $2 \times 10^{-4}$ $\Omega$cm$^2$ for Au/Pt/Pd, where the hole concentration of the p-type ZnTe was $p = 3 \times 10^{19}$cm$^{-3}$. Further, specific contact resistance of the Au/Pt/Ti with respect to p-type ZnTe having the hole concentration of $p = 3.9 \times 10^{18}$cm$^{-3}$ was $\sim 10^{-2}$cm$^{-3}$. By comparing the values of the specific contact resistances, it is known that an extremely low specific contact resistance is obtained by using a Pd film as a lowest layer of an ohmic electrode and by annealing the ohmic electrode fabricated.

On the other hand, by evaluation of adhesion of the Au/Pt/Pd ohmic electrode of FIG. 1 and the Au/Pd ohmic electrode of FIG. 2 to the p-type ZnTe layer 2, it was confirmed that an excellent adhesion is obtained as compared with that of conventional ohmic electrodes fabricated by using Au or Ag.

Discussed below is a result of measuring specific contact resistances of Ohmic electrodes with respect to the p-type ZnTe layer by the TLM (transmission-line model) method.

Samples used in the measurement of specific contact resistance by the TLM method were prepared, in the same manner as those of the samples shown in FIGS. 1 and 2, by epitaxial growth of the p-type ZnTe layer 2 on the (001)-oriented semi-insulating GaAs substrate 1, followed by making a TLM pattern thereon. The thickness of the p-type ZnTe layer 2 was 1.3 μm, and its hole concentration and mobility were $3 \times 10^{19}$cm$^{-3}$ and 18 cm$^2$/Vs, respectively. The TLM pattern was made by depositing a metal film on the p-type ZnTe layer 2 by vacuum evaporation in a vacuum evaporation apparatus using an electron beam and then patterning the metal film by wet etching. The wet etching used $K_2Cr_2O_7$:$H_2SO_4$:$H_2O$ solution as an etchant and overetched the metal film until reaching the semi-insulating GaAs substrate 1.

Thus, a sample having the TLM pattern of a single-layered Au film, a sample having the TLM pattern of the Au/Pt structure, a sample having the TLM pattern of the Au/Pd structure, and a sample having the TLM pattern of the Au/Pt/Pd structure were prepared. After annealing these samples at 200° C. for three minutes while introducing $H_2$ gas in a typical annealing furnace, their specific contact resistances were measured by the TLM method. Table 1 shows a result of the measurement. The thickness of the Pd film in the Au/Pd TLM pattern and the Au/Pt/Pd TLM pattern was 10 nm.

TABLE 1

| METAL | SPECIFIC CONTACT RESISTANCE ($\Omega$ cm$^2$) |
|---|---|
| Au | $1.9 \times 10^{-4}$ |
| Au/Pt | $1.8 \times 10^{-4}$ |
| Au/Pd | $4.8 \times 10^{-6}$ |
| Au/Pt/Pd | $6.4 \times 10^{-6}$ |

It is known from Table 1 that the specific contact resistance of the ohmic electrode having the Au/Pd or Au/Pt/Pd structure including the Pd film as its lowest layer is $(5 \text{ to } 6) \times 10^{-6}$ $\Omega$cm$^2$ which is about two orders of magnitude lower than that of an ohmic electrode having the Au or Au/Pt structure. This value of the specific contact resistance, $(5 \text{ to } 6) \times 10^{-6}$ $\Omega$cm$^2$, is sufficiently low for application to normal devices.

Figure 8:
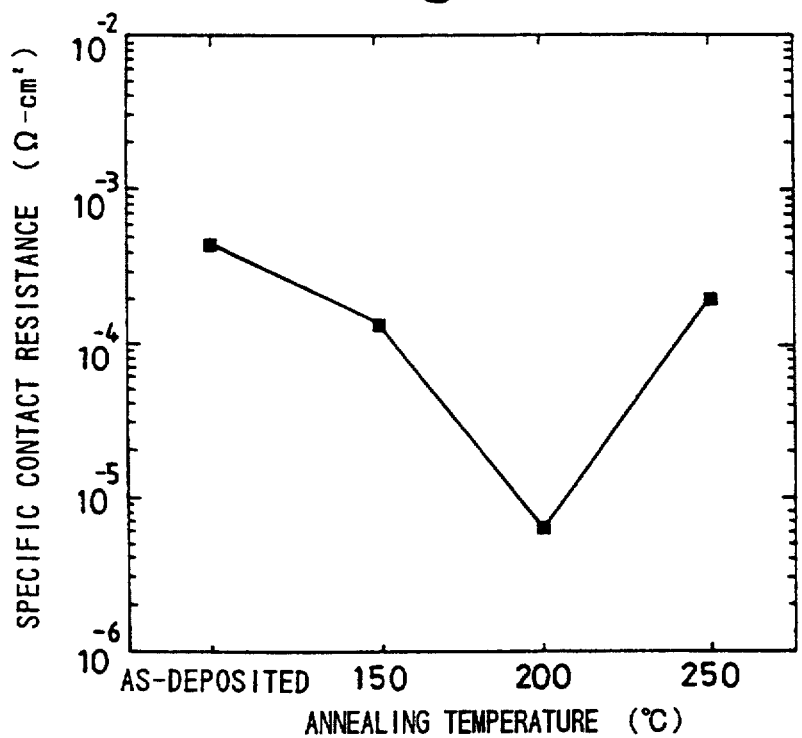
FIG. 8 is a graph showing dependency of specific contact resistance on annealing temperature obtained by measuring specific contact resistances of samples each having a TLM pattern of an Au/Pt/Pd structure on a p-type ZnTe layer after annealed at different temperatures.

FIG. 8 shows dependency of contact specific resistances on annealing temperature which was obtained by measuring specific contact resistances of samples each having the Au/Pt/Pd TLM pattern after annealing them at various temperatures for three minutes while introducing $H_2$ gas in a typical annealing furnace. It is known from FIG. 8 that the specific contact resistance is minimized at the annealing temperature of 200° C. and that the minimum value is about $6 \times 10^{-6}$$\Omega$cm$^2$. It is also known from FIG. 8 that a specific contact resistance not larger than about $1 \times 10^{-4}$$\Omega$cm$^2$ at the annealing temperature of 150° to 250° C.

For the purpose of confirming that annealing does not affect the p-type ZnTe layer 2, specific contact resistances of further samples were measured. One of the further samples was prepared by epitaxial growth of a p-type ZnTe layer 2 on a semi-insulating GaAs substrate 1, by annealing it at 300° C. for three minutes while introducing $H_2$ gas in a typical annealing furnace, and by thereafter making a TLM pattern of an Au/Pt/Pd structure. The other of the further samples was prepared by epitaxial growth of a p-type ZnTe layer 2 on a semi-insulating GaAs substrate 1, by depositing a multi-layered metal film of the Au/Pt/Pd structure, by annealing it at 300° C. for three minutes while introducing $H_2$ gas in a typical annealing furnace and by thereafter making a TLM pattern by patterning of the multi-layered metal film. As a result of the measurement, the former sample exhibited the same specific contact resistance as that of the sample not annealed, but the latter sample exhibited a larger specific contact resistance. This shows that annealing at temperature of 300° C. does not affect the p-type ZnTe layer 2, but increases the specific contact resistance of the ohmic electrode.

Figure 9:
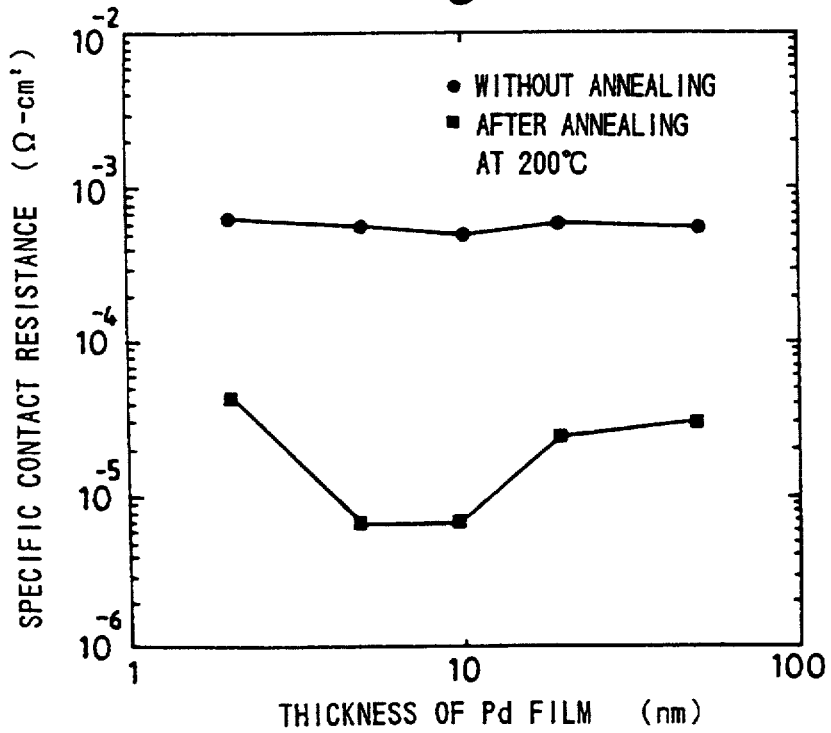
FIG. 9 is a graph showing dependency of specific contact resistance on thickness of the Pd film obtained by measuring specific contact resistances of samples having a TLM pattern of an Au/Pt/Pd structure on a p-type ZnTe layer and different in thickness of the Pd film after annealed at 200° C.

FIG. 9 shows dependency of specific contact resistances on thickness of the Pd film which was obtained by measuring specific contact resistances of samples each having a TLM pattern of an Au/Pt/Pd structure but different in thickness of the Pd film, after annealing them at 200° C. for three minutes while introducing H$_2$ gas in a typical annealing furnace. For comparison purposes, FIG. 9 also shows dependency of specific contact resistances on thickness of the Pd film of samples not annealed. It is known from FIG. 9 that the specific contact resistance of the sample not annealed does not substantially depend on thickness of the Pd film and that the specific contact resistance of the sample annealed at 200° C. largely changes with thickness of the Pd film and exhibits a minimum value with 5 to 10 nm. The specific contact resistance with a thickness of the Pd film not less than 20 nm is the same as that of a structure in which bulk Pd is in contact with a p-type ZnTe layer, and does not depend on thickness of the Pd film.

On the other hand, as to a sample having a TLM pattern of the Au/Pd structure, dependency of specific contact resistance on annealing temperature and dependency of specific contact resistance on thickness of the Pd film as those of FIGS. 8 and 9 were measured. Then, similar dependencies as those of FIGS. 8 and 9 were obtained, and values of the specific contact resistance were substantially the same. This shows that the Pt film in an ohmic electrode of the Au/Pt/Pd structure is not essentially indispensable. In addition, as to a sample in which the hole concentration of the p-type ZnTe layer 2 is $3 \times 10^{18}$cm$^{-3}$ which is an order of magnitude lower than that of the p-type ZnTe layer 2 referred to above, dependency of specific contact resistance on annealing temperature and dependency of specific contact resistance on thickness of the Pd film as those of FIGS. 8 and 9 were measured. Then, values of the specific contact resistance were about two orders of magnitude higher, but the dependencies were similar to those of FIGS. 8 and 9. From this, it can be said that optimum conditions for annealing temperature and thickness of the Pd film to obtain a low specific contact resistance are independent from hole concentration of the p-type ZnTe layer 2 and universal.

As referred to above, by making the lowest portion of the ohmic electrode in contact with the p-type ZnTe layer in the form of the Pd film 3, an ohmic electrode having an excellent adhesion and an excellent ohmic characteristic with respect to the p-type ZnTe layer 2 can be obtained. The improvement of adhesion prevents exfoliation of the ohmic electrode and increases the reliability. In addition, by annealing the ohmic electrode after it is fabricated, the specific contact resistance of the ohmic electrode can be reduced sufficiently. As a result, heat generation at the contact between the ohmic electrode and the p-type ZnTe layer 2 is suppressed, and deterioration in characteristics and other adverse influences by heat can be prevented.

No clear reason has been known why an ohmic electrode excellent in adhesion and ohmic characteristic can be obtained by making the lowest portion of the ohmic electrode in contact with the p-type ZnTe layer 2 in the form of the Pd film 3; however, the following phenomenon may be a reason thereof.

According to a report (Phys. Rev. B 39(1989)10744), when a Pd film as thin as several atomic layers is fabricated on ZnSe, Pd breaks the surface of ZnSe and enters into ZnSe at room temperature. The same phenomenon probably occurs also when a Pd film is fabricated on ZnTe. That is, with regard to the ohmic electrodes shown in FIGS. 1 and 2, certain reaction probably occurs at the interface between Pd and p-type ZnTe, which results in improvement in adhesion and ohmic characteristic of the ohmic electrode. FIGS. 8 and 9 show that such a reaction at the interface between Pd and p-type ZnTe is liable to occur as the annealing temperature increases.

Figure 10:
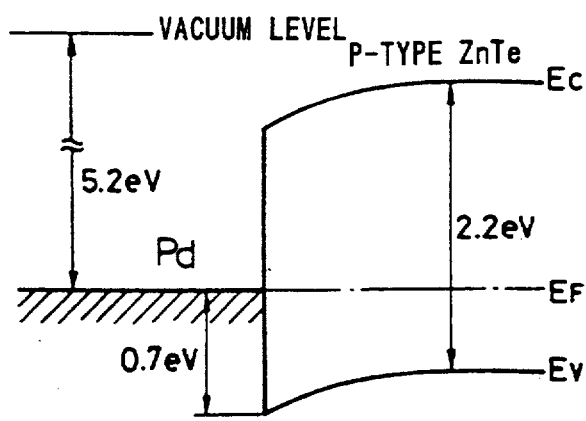
FIG. 10 is an energy band diagram of the junction between Pd and p-type ZnTe.

Further, the work function of Pd is as large as $\sim 5.2$ eV, and it is expected that, when Pd is brought in contact with ZnTe, the barrier at the junction is lowered. Additionally, although in regard to ZnSe, it is known that Pd makes the Schottky barrier lower than Ti, Ag, Au, or the like (Phys. Rev. B 39(1989)10744). These phenomena probably result in an improvement in adhesion and ohmic characteristic of the ohmic electrodes shown in FIGS. 1 and 2. For reference, FIG. 10 shows an energy band diagram in the case where Pd and p-type ZnTe are brought in contact.

Next explained is a second embodiment in which the invention is applied to a ZnMgSSe semiconductor laser.

Figure 11:
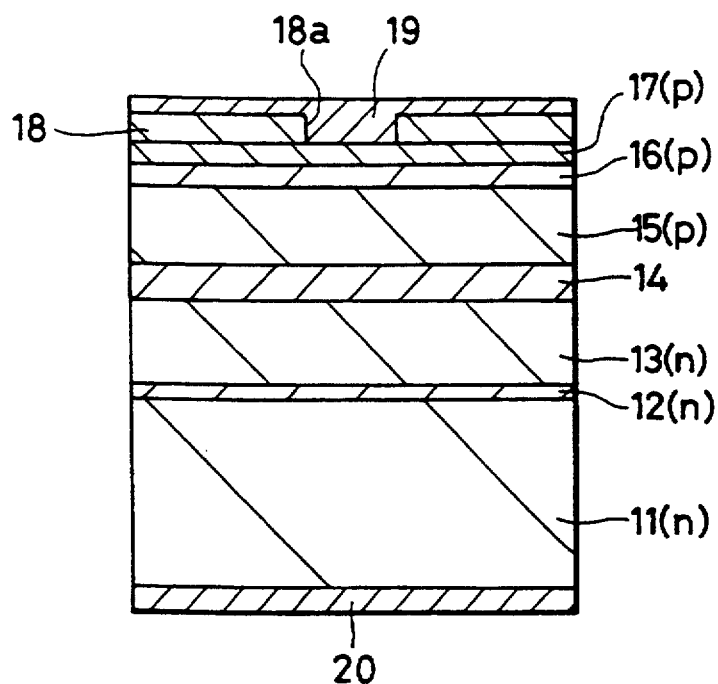
FIG. 11 is a cross sectional view of a ZnMgSSe semiconductor laser according to a second embodiment of the invention.

As shown in FIG. 11, a ZnMgSSe semiconductor laser according to a second embodiment, includes a (001)-oriented n-type GaAs substrate 11 doped with, for example, Si as an n-type impurity. Stacked on the n-type GaAs substrate 11 are, in sequence: an n-type ZnSe buffer layer 12 doped with, for example, Cl as an n-type impurity; an n-type ZnMgSSe cladding layer 13 doped with, for example Cl, as an n-type impurity; an active layer 14, a p-type ZnMgSSe cladding layer 15 doped with, for example, N as a p-type impurity; a p-type ZnSe contact layer 6 doped with, for example, N as a p-type impurity, and a p-type ZnTe contact layer 17 doped with, for example, N as a p-type impurity. Provided on the p-type ZnTe contact layer 17 is an insulating layer 18 made of, for example, polyimide, an SiO$_x$ film or an SiN$_x$ film and having a stripe-shaped opening 18$a$ through which an Au/Pd electrode 19 as the p-side ohmic electrode, having the same structure as shown in FIG. 2, contacts the p-type ZnTe contact layer 17. On the back surface of the n-type GaAs substrate 11 is provided an In electrode 20 as the n-side ohmic electrode.

The active layer 14 is made, for example, of a multiquantum well (MQW) layer which includes, for example, ZnSe layers as well layers and ZnMgSSe layers as barrier layers, or may be made of a ZnSe layer.

Since lattice mismatching, although small, exists between ZnSe and GaAs, dislocation may be caused by the lattice mismatching during epitaxial growth of the n-type ZnSe buffer layer 12 or other layers thereon. To prevent this, the thickness of the n-type ZnSe buffer layer 12 is chosen in the range of 1 to 50 nm which is sufficiently smaller than the critical thickness of ZnSe ($\sim 100$ nm).

The thickness of the n-type ZnMgSSe cladding layer 13 is, for example, 1 fm, and the impurity concentration thereof is $N_A - N_D$ (where $N_D$ is the donor concentration and $N_A$ is the acceptor concentration)=$8 \times 10^{17}$cm$^{-3}$. The electron concentration corresponding to the impurity concentration is about n=$5 \times 10^{17}$cm$^{-3}$ cm in terms of a result of Hall measurement at room temperature. The thickness of the p-type ZnMgSSe cladding layer 15 is, for example, 600 nm, and the impurity concentration thereof is $N_A - N_D = 8 \times 10^{16}$cm$^{-3}$, for example. The thickness of the p-type ZnSe contact layer 16 is, for example, 150 nm, and the impurity concentration is $N_A - N_D = 5 \times 10^{17}$cm$^{-3}$ for example.

If ZnMgSSe is expressed as $Zn_xMg_{1-x}S_ySe_{1-y}'$ composition of the n-type ZnMgSSe cladding layer 13 and that of the p-type ZnMgSSe cladding layer 15 are preferably chosen at x=0.90 and y=0.18 from the viewpoint of the doping concentration and the band gap $E_g$. It has been confirmed by X-ray diffraction that $Zn_xMg_{1-x}S_ySe_{1-y}$ of the foregoing composition exhibits a lattice matching with GaAs.

A method for manufacturing the ZnMgSSe semiconductor laser according to the second embodiment arranged as described above is explained below.

First epitaxially grown on the n-type GaAs substrate 11 are, in sequence, the n-type ZnSe buffer layer 12, the n-type ZnMgSSe cladding layer 13, the active layer 14, the p-type ZnMgSSe cladding layer 15, the p-type ZnSe contact layer 16, and the p-type ZnTe contact layer 17 by, for example, the MBE method.

The epitaxial growth by MBE uses Zn of purity 99.9999% as a Zn source material, Mg of purity 99.99% as a Mg source material, ZnS of purity 99.9999% as an S source material, and Se of purity 99.9999% as a Se source material. Further, doping of Cl as an n-type impurity for the n-type ZnSe buffer layer 12 and the n-type ZnMgSSe cladding layer 13 is done by using $ZnCl_2$ of purity 99.9999% as a dopant, while doping of N as a p-type impurity for the p-type ZnMgSSe cladding layer 15, the p-type ZnSe contact layer 16, and the p-type ZnTe contact layer 17 is done by irradiating $N_2$ plasma generated by, for example, ECR.

Next, after the insulating film 18 is provided on the above-described n-type ZnTe contact layer 17, the insulating film 18 is selectively removed to make the stripe-shaped opening 18a. Next, after the Au/Pd electrode 19 is provided by depositing a Pd film and a Au film onto the entire surface by vacuum evaporation at, for example, room temperature, annealing is done at temperature of, for example, 150° to 250° C. Made on the back surface of the n-type GaAs substrate 11 is the In electrode 20.

By taking these steps, a desired ZnMgSSe semiconductor laser shown in FIG. 11 is finished.

According to the second embodiment, by using the Au/Pd electrode 19 excellent in adhesion, ohmic characteristic and specific contact resistance as the ohmic electrode to the p-type ZnTe contact layer 17, the reliability and characteristic of the ZnMgSSe semiconductor laser can be improved. Additionally, with the construction according to the second embodiment, it is possible to realize a semiconductor laser capable of continuous oscillation of blue light at least at 77K.

Figure 12:
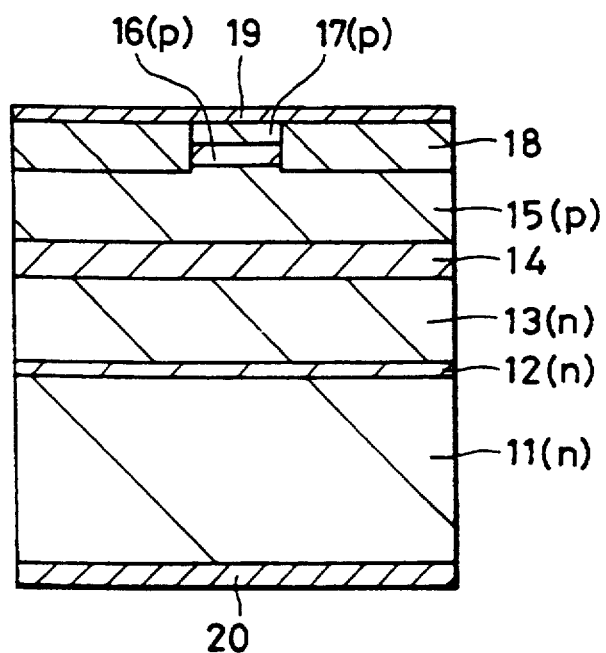
FIG. 12 is a cross sectional view of a ZnMgSSe semiconductor laser according to a third embodiment of the invention.

FIG. 12 shows a third embodiment in which the invention is applied to a ZnMgSSe semiconductor laser.

As shown in FIG. 12, the ZnMgSSe semiconductor laser according to the third embodiment includes an internal stripe structure made by shaping the p-type ZnSe contact layer 16 and the p-type ZnTe contact layer 17 in the form of stripes. Other parts of the third embodiment are the same as that of the ZnMgSSe semiconductor laser according to the second embodiment shown in FIG. 11, and explanation thereof is omitted here.

Also the third embodiment gives the same advantages as those of the second embodiment.

Figure 13:
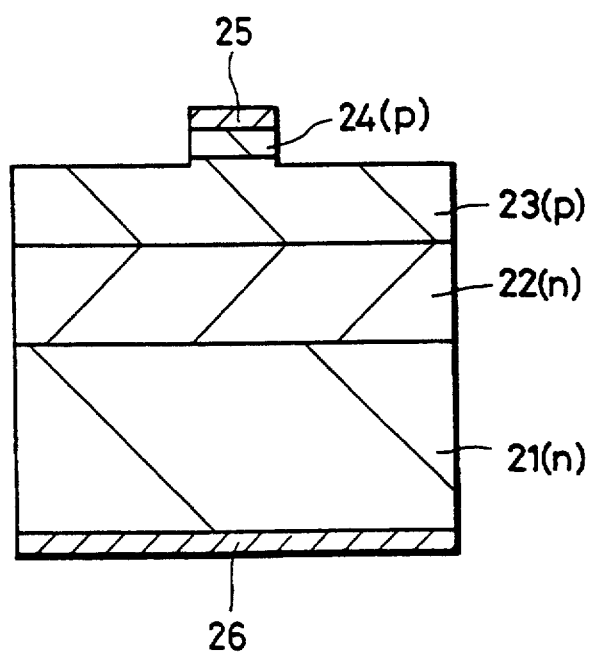
FIG. 13 is a cross sectional view of a ZnSe light emitting diode according to a fourth embodiment of the invention.

FIG. 13 shows a fourth embodiment in which the invention is applied to a ZnSe light emitting diode.

As shown in FIG. 13, the ZnSe light emitting diode exhibits a pn junction made by stacking, in sequence, an n-type ZnSe layer 22 and a p-type ZnSe layer 23 on an n-type GaAs substrate 21. A stripe-shaped p-type ZnTe contact layer 24 is made on the p-type ZnSe layer 23, and an Au/Pd electrode 25 is made thereon as the p-side ohmic electrode. Made on the back surface of the n-type GaAs substrate 21 is an In electrode 26 as the n-side ohmic electrode.

According to the fourth embodiment, a ZnSe light emitting diode excellent in reliability and characteristics can be realized by using the Au/Pd electrode 25 as the ohmic electrode to the p-type ZnTe contact layer 24.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, an Ag/Pd electrode may be used as the p-side ohmic electrode in lieu of the Au/Pd or Au/Pt/Pd electrode used in the foregoing embodiments.

Figure 14:
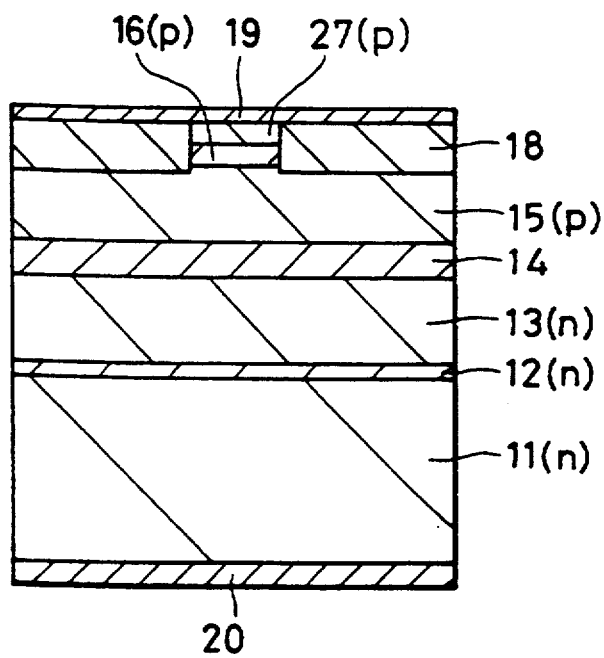
FIG. 14 is a cross sectional view of a ZnMgSSe semiconductor laser according to a modification of the third embodiment of the invention.
Figure 15:
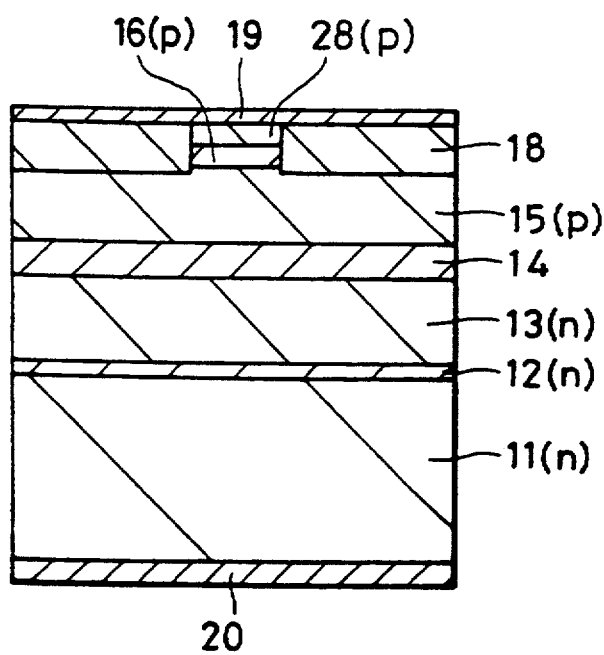
FIG. 15 is a cross sectional view of a ZnMgSSe semiconductor laser according to another modification of the third embodiment of the invention.

Further, as the semiconductor layer in contact with the p-side ohmic electrode, a p-type $ZnSe_xTe_{1-x}$ contact layer 27 shown in FIG. 14 which is described in Japanese Laid Open Patent Publication No. 122565/1990 or a p-type ZnSe/ZnTe MQW layer 28 shown in FIG. 15 which is described in Japanese Patent Application Nos. 185821/1992 and 127832/1993 may be used in lieu of the p-type ZnTe contact layer 17 used in the foregoing embodiments.

What is claimed is:

1. An ohmic electrode comprising:
   a layer selected from the group of Pd or an alloy containing Pd in contact with a p-type II–VI compound semiconductor;
   a metal layer provided on said layer selected from the group of Pd an alloy containing Pd, and
   wherein said layer selected from the group of Pd or an alloy containing Pd has a thickness of 4 to 15 nm.

2. A light emitting device comprising:
   an n-type first II–VI compound semiconductor layer;
   a p-type second II–VI compound semiconductor layer provided on said n-type first II–VI compound semiconductor layer;
   a first electrode electrically connected to said n-type first II–VI compound semiconductor layer;
   a p-type third II–VI compound semiconductor layer provided on said second p-type second II–VI compound semiconductor layer;
   a second electrode in contact with said p-type third II–VI compound semiconductor layer and said second electrode selected from the group of Pd or an alloy containing Pd, and
   wherein said p-type third II–VI compound semiconductor layer is made of ZnTe.

3. The light emitting device according to claim 2 further comprising an active layer between said n-type first II–VI compound semiconductor layer and said p-type second II–VI compound semiconductor layer.

4. The light emitting device according to claim 2 wherein said n-type first II–VI compound semiconductor layer and said p-type second II–VI compound semiconductor layer are made of ZnMgSSe.

5. The light emitting device according to claim 2 wherein said n-type first II–VI compound semiconductor layer and said p-type second II–VI compound semiconductor layer are made of ZnSe.

6. A light emitting device comprising:
an n-type first II–VI compound semiconductor layer;
a p-type second II–VI compound semiconductor layer provided on said n-type first II–VI compound semiconductor layer;
a first electrode electrically connected to said n-type first II–VI compound semiconductor layer;
a p-type third II–VI compound semiconductor layer provided on said second p-type second II–VI compound semiconductor layer;
a second electrode in contact with said p-type third II–VI compound semiconductor layer and said second electrode selected from the group of Pd or an alloy containing Pd, and
wherein said p-type third II–VI compound semiconductor layer is made of $ZnSe_xTe_{1-x}$.

7. A light emitting device comprising:
an n-type first II–VI compound semiconductor layer;
a p-type second II–VI compound semiconductor layer provided on said n-type first II–VI compound semiconductor layer;
a first electrode electrically connected to said n-type first II–VI compound semiconductor layer:
a p-type third II–VI compound semiconductor layer provided on said p-type second II–VI compound semiconductor layer;
a second electrode in contact with said p-type third II–VI compound semiconductor layer and said second electrode selected from the group of Pd or an alloy containing Pd, and
wherein said p-type third II–VI compound semiconductor layer is made of ZnSe/ZnTe superlattice.

* * * * *